(12) United States Patent
Law (10) Patent No.: US 6,835,070 B1
(45) Date of Patent: Dec. 28, 2004

(54) COOLING ARRANGEMENT FOR ELECTRONIC SYSTEMS

(75) Inventor: Randall A. Law, Surrey (CA)

(73) Assignee: Cray Canada Inc., Burnaby (CA)

( * ) Notice: Subject to any disclaimer, the term of this patent is extended or adjusted under 35 U.S.C. 154(b) by 0 days.

(21) Appl. No.: 10/706,924

(22) Filed: Nov. 14, 2003

(51) Int. Cl.[7] .............................................. H01R 12/00
(52) U.S. Cl. ........................................ 439/61; 439/206
(58) Field of Search ............................. 439/61, 62, 69, 439/206; 361/752, 386, 415

(56) References Cited

U.S. PATENT DOCUMENTS

| | | | | |
|---|---|---|---|---|
| 4,304,966 A | * | 12/1981 | Beirn et al. ................. | 379/165 |
| 4,602,829 A | * | 7/1986 | De Andrea ............... | 312/223.1 |
| 4,862,400 A | * | 8/1989 | Selbrede ...................... | 361/683 |
| 5,876,243 A | * | 3/1999 | Sangawa ..................... | 439/519 |
| 6,019,623 A | * | 2/2000 | Ito et al. ..................... | 439/206 |

* cited by examiner

*Primary Examiner*—Hien Vu
(74) *Attorney, Agent, or Firm*—Oyen Wiggs Green & Mutala (57) ABSTRACT

Cards in an electronic device are mounted parallel to one another. The cards are offset relative to one another. The electronic device has a case. In a vicinity of the cards the case follows a crooked path to provide an aperture-bearing portion adjacent to an outer end of each of the cards. Transitional portions of the case connect adjacent aperture-bearing portions which are at different levels. Vent apertures are provided in the transitional portions.

18 Claims, 10 Drawing Sheets

COOLING ARRANGEMENT FOR ELECTRONIC SYSTEMS

TECHNICAL FIELD

This invention relates to the cooling of electronic equipment. The invention has application in the cooling of computer equipment.

BACKGROUND

Electronic equipment, and computers in particular, are becoming increasingly powerful. High performance electronic systems tend to generate significant amounts of heat. Modern computer systems need cooling systems to remove the heat generated by computer components such as central processing units (CPUs), graphics processing units (GPUs), high speed interface circuits, and the like. One of the problems faced in the cooling of modern electronic equipment is achieving adequate air flow through the case in which the equipment is housed to move heat out of the system.

Some personal computers have many fans to cause air to pass over and remove heat from hot components. For example, a modern personal computer may have a fan in the power supply, a powerful fan on a heat sink over the CPU, a fan on the (GPU) of the video card, a fan on an interface integrated circuit, and possibly an extra fan to push additional air into the case. The need to cool the components of high performance computer systems has led to the development of water and Freon based cooling systems despite the cost and complexity of such systems.

There are many significant sources of heat in a modern personal computer. In addition to the CPU and the power supply, these sources of heat can include peripheral cards (e.g. ISA, AGP, PCI, PCI-X, PCIExpress™, InfiniBand™, etc.). Video cards, in particular generate significant amounts of heat.

Figure 1:
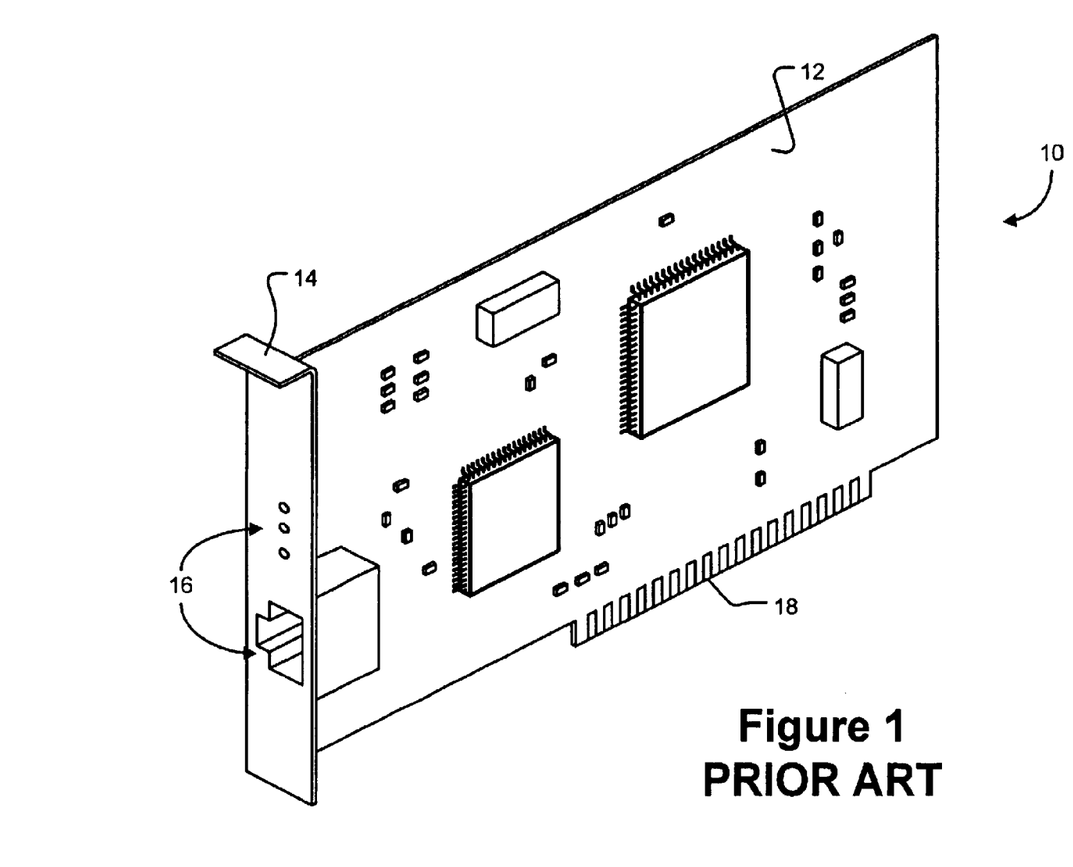
FIG. 1 is a perspective view of a prior art peripheral card.

Computer systems and certain other electronic equipment typically include a number of cards which plug into a main system board or backplane. FIG. 1 shows, for example, a typical peripheral card 10. Card 10 comprises a printed circuit board (PCB) 12 with a plate 14 attached at one of its ends. Plate 14 is typically a metal plate. Plate 14 extends at right angles to PCB 12. Plate 14 typically includes one or more connectors, and/or indicators 16 in order for users to make use of the function provided by the card (e.g. video, network, modem).

Figure 2:
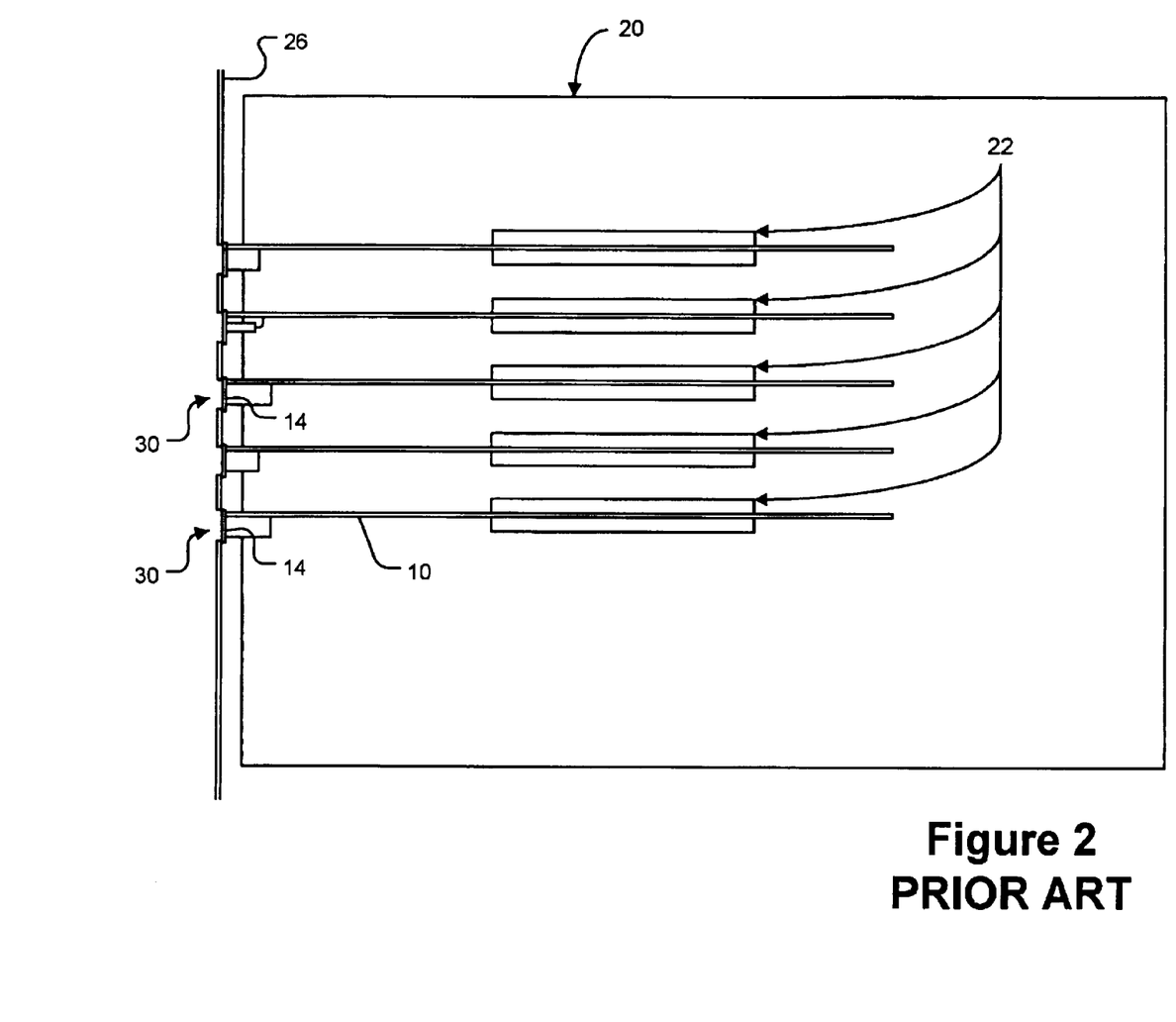
FIG. 2 is a top plan view of a number of peripheral cards illustrating the placement of peripheral cards relative to the system case of a prior art system.

One or more connectors 18 are provided to plug card 10 into corresponding mating connectors of a main system board or backplane. As shown in FIG. 2, a main board 20 typically has a row of peripheral card connectors 22 laid out parallel to a flat side 26 of a case. Connectors 22 are positioned and oriented such that when a peripheral card 10 is plugged in, its plate 14 will line up with and be flush against an opening 30 in side 26. This construction exposes connectors and indicators 16 on plates 14 to the outside of the case for use. Openings 30 are lined up beside each other and are typically closely spaced to maximize the number of peripheral cards that can be accommodated by the case.

In some electronic equipment, the case geometry does not provide room to plug peripheral cards directly into the main system board. This is common in rack mounted equipment. In such systems, peripheral cards are mounted horizontally and plug into a separate PCB which in turn plugs into the main system board.

Where electronic equipment is mounted in vertical racks (e.g. 19" and 23" equipment racks), it is generally not possible to provide effective air vents on the top, bottom or sides of the equipment. It has to be assumed that there will be other equipment mounted above and below the electronic equipment in question. It has to be assumed that there will be other racks alongside the rack containing the electronic equipment in question. In most cases, the only option is to pass air through the front and back of the electronic equipment.

Figure 3A:
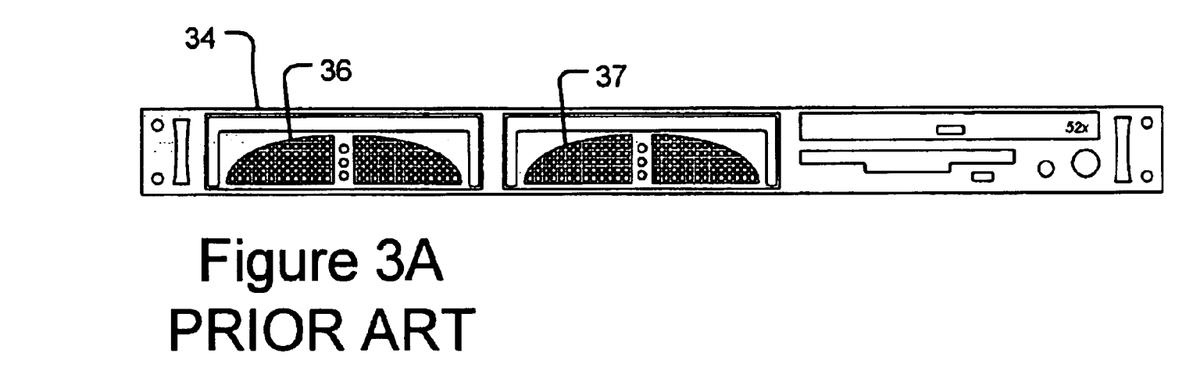
FIG. 3A is a front view of a rack mount computer of a general type known in the prior art.

Providing adequate venting on the front and back faces of a rack-mounted electronic system is difficult. The front of the system may have some combination of a display device (e.g. LCD), a small keypad, pluggable disk drive cartridges, floppy drives, etc. For example, the rack mounted computer 34 shown in FIG. 3A only has air vents in the front bezels of removable disk drives 36 and 37.

Figure 3B:
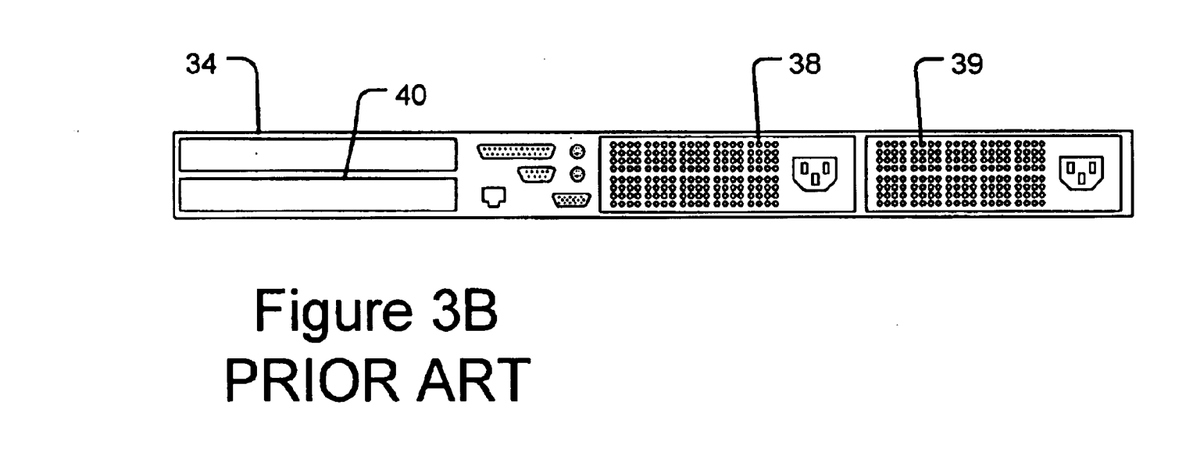
FIG. 3B is a rear view of the rack mount computer of FIG. 3A.

FIG. 3B shows the back of computer 34. The back of rack mounted electronic systems usually have cable connectors for power, network communication, display monitors, serial communication lines, etc. The back of the system may also be encumbered by the area 40 reserved for plug-in peripheral cards. As a result of all these components it can be difficult to allocate adequate area for cooling air vents. For example, the back of computer 34 only has air vents in two power supply modules 38 and 39.

If a peripheral card slot is not being used, the opening in the case corresponding to that slot could be left open to allow for cooling air flow. This would allow electromagnetic interference (EMI) to escape from the equipment however. It is standard practice to close up the unused openings using blank metal plates.

One vendor currently offers a fan in a PCI card form factor that plugs into an empty slot in a personal computer. The fan draws air into the system through an opening in the metal plate and blows it on to other peripheral cards and through the rest of the system. This reduces the number of peripheral cards that can be accommodated.

There is a need for improved air cooling systems for electronic equipment and, particularly, for peripheral cards of electronic equipment.

SUMMARY OF THE INVENTION

This invention provides electronic equipment which includes venting openings in the vicinity of add in cards. One aspect of the invention provides electronic apparatus comprising at least first and second connectors spaced apart from one another to accommodate first and second adjacent parallel cards. The first and second connectors are located at different distances in a first direction along the first and second cards from an imaginary line extending perpendicular to the parallel cards. The apparatus includes a case. The case encloses the first and second connectors. The case has a wall which has first and second aperture-bearing portions respectively carrying first and second apertures. The apertures are respectively located to expose end portions of the first and second cards. The first and second aperture-bearing portions are at different levels in the first direction. The case includes a transitional portion between the first and second aperture-bearing portions, the transitional portion includes at least one vent aperture.

Another aspect of the invention provides electronic apparatus comprising a plurality of mutually-adjacent slots for receiving added cards. Each of the slots comprises a connector spaced-apart from an aperture-bearing portion of a case by a standard distance. The aperture-bearing portions of the case are each apertured to expose an end portion of a card, if present, in the corresponding slot. The aperture-bearing portions of the case are at a plurality of different levels relative to an imaginary line extending perpendicular to the slots. The case includes one or more transitional portions extending between adjacent aperture-bearing portions of different levels. The transitional portions including vent openings.

Further aspects of the invention and features of specific embodiments of the invention are described below.

BRIEF DESCRIPTION OF THE DRAWINGS

In drawings which illustrate non-limiting embodiments of the invention:

FIG. 8, is an isometric view illustrating possible locations of air vents in the protrusion of FIG. 7; and, FIG. 9 is a section through a system case and peripheral cards of an electronic system wherein slots for receiving peripheral cards are angled relative to a case of the system.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

This invention provides electronic systems designed to accommodate peripheral cards in such a manner that the rear plates of adjacent peripheral cards are staggered relative to one another. Cases of systems according to the invention have additional surfaces in which venting apertures may be provided.

Figure 4:
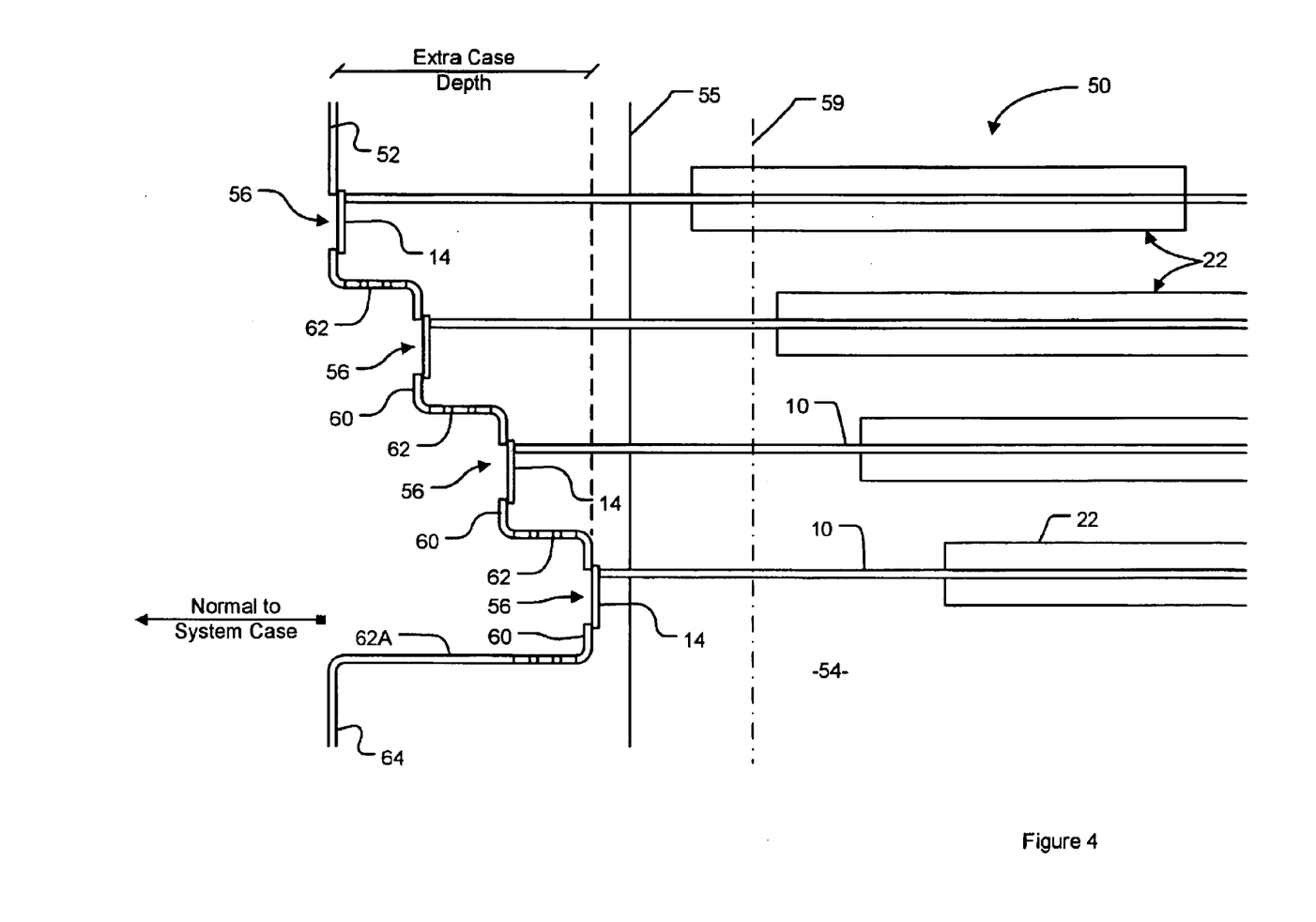
FIG. 4 is a sectional view through a system case according to the invention having peripheral card openings staggered in a direction normal to a surface of the system case.

FIG. 4 shows electronic equipment 50 according to one embodiment of the invention. Equipment 50 has a case 52 which houses a board 54 bearing connectors 22 for receiving peripheral cards 10. Case 52 may be made of an electrical conductor, such as a suitable metal, to provide shielding against electromagnetic radiation. Case 52 has openings 56 for receiving plates 14 of peripheral cards 10. Plates 14 are also typically of metal. The distance between connectors 22 and plates 14 is typically standardized so that peripheral cards (or, more generally, add in cards) from various manufacturers can be used in equipment 50.

The locations capable of receiving add-in cards may be called slots. When an add-in card is present in a slot, a connector on the add-in card engages the connector 22 of the slot and an end plate of the add-in card extends to an aperture-bearing portion of case 52 which is penetrated by the aperture 56 for that slot. The embodiment of FIG. 4 has four mutually-adjacent slots.

In equipment 50, connectors 22 are oriented so that peripheral cards 10 extend generally parallel to one another. Connectors 22 are not all located at the same distance from a line, such as line 59, which extends substantially perpendicular to peripheral cards 10. This causes plates 14 of at least some adjacent peripheral cards 10 to be located at different distances from line 59 (i.e. at different levels relative to an imaginary line extending transversely to the slots). Line 59 is typically parallel to a rear edge 55 of board 54 although this is not mandatory (see, for example, FIG. 9).

The portion of case 52 in which apertures 56 are formed is not flat but follows a crooked path so that aperture-bearing portions 60 which carry apertures 56 are at the expected locations of plates 14. This portion of case 52 includes transitional sections 62 which connect aperture-bearing portions 60 which are at different levels to one another and transitional sections 62A which connect aperture-bearing portions 60 to surrounding portions 64 of case 52 which are not at the same level as the corresponding aperture-bearing portions 60. Individual ones of aperture-bearing portions 60 may be deeper than, at the same level as, or shallower than portions 64 of case 52 which surround the area accommodating peripheral cards 10.

In equipment 50, case 52 is slightly deeper than it would be otherwise. The extra depth allows the surface of the case in the area of peripheral cards 10 to be staggered as shown. It is usually possible to extend the depth of the case by a small amount, such as 1–2 inches or even a few inches without any problems.

It can be seen that the surface area of the rear face of case 52 in the vicinity of cards 10 is increased significantly relative to that of case 26 (FIG. 2). Transitional sections 62 and 62A provide surfaces which are available to accommodate vents.

Figure 5:
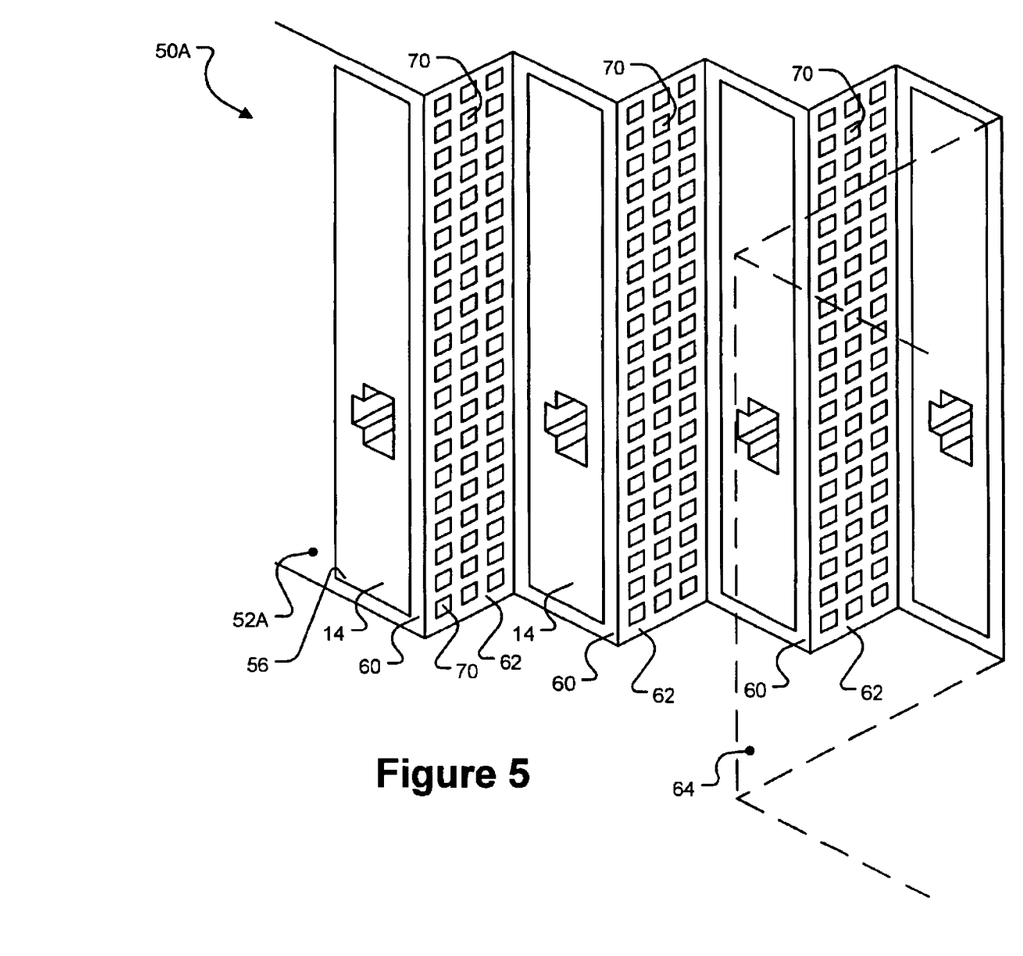
FIG. 5 is a partial isometric view showing the placement of air vents between peripheral card openings in a system case according to the invention and FIG. 5A is an elevation view thereof.

As shown in FIG. 5, in electronic equipment 50A according to one embodiment of the invention, openings 70 are provided in transitional sections 62 in the vicinity of peripheral card apertures 56. Openings 70 may function as vents to allow cooling air to be drawn into case 52A in the immediate vicinity of peripheral cards. If EMI is a concern, openings 70 can be covered with EMI protection (e.g. a metal mesh) or provided in the pattern of a mesh as shown in FIG. 5. While FIG. 5 shows regular arrays of openings 70, openings 70 may be arranged in any suitable pattern. Openings 70 may have any suitable sizes and shapes. In some embodiments, openings 70 have the form of elongated slots.

Figure 5A:
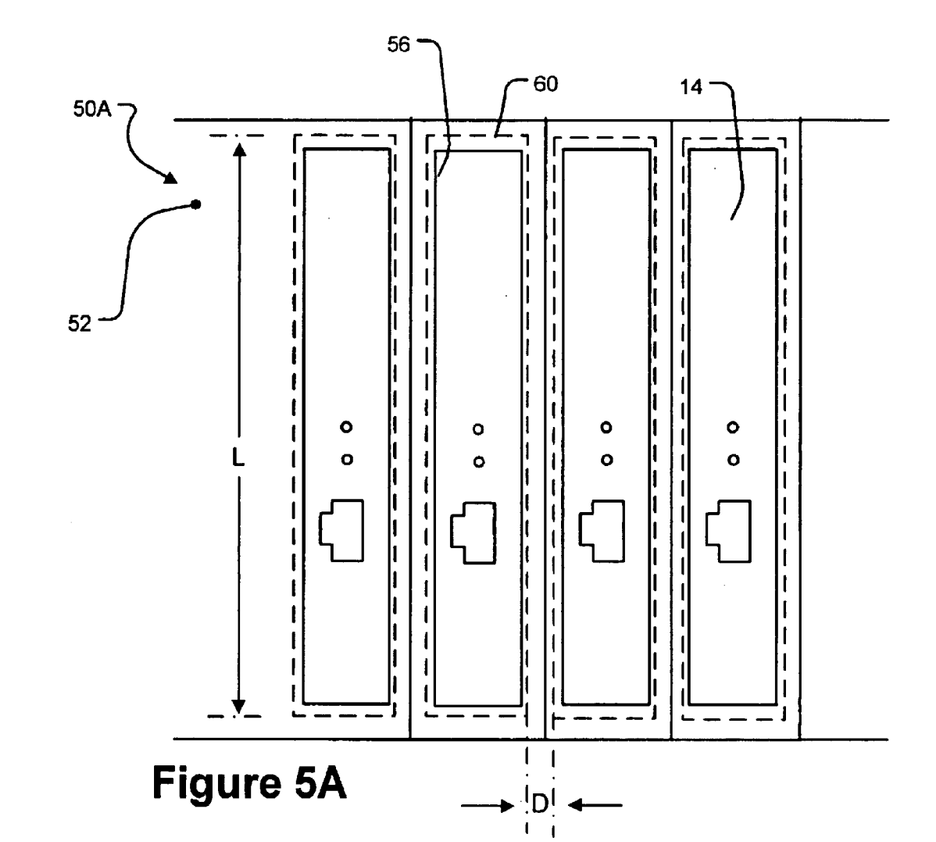

FIG. 5A shows an elevational view of system 50A. It can be seen that the spacing D between plates 14 in a direction perpendicular to cards 10 can be small. The area of transitional portions 62 which can bear vent openings 70 can be significantly larger than the projected area D×L between plates 14 as seen in FIG. 5A. In some embodiments of the invention, the area of one or more transitional portions 62 exceeds the projected area D×L by a factor in excess of 3, 5, 10 or 15. In some embodiments, the distance measured along a transitional portion 62 exceeds D by a factor in excess of 3, 5, 10 or 15.

In the embodiment of FIG. 5A, apertures 56 are elongated. More specifically, apertures 56 are rectangular. End plates 14 are slightly larger than apertures 56 and overlap apertures 56.

In apparatus capable of accommodating several peripheral cards, the levels of peripheral card apertures 56 can vary according to any of various patterns, either regular or random. A suitable pattern may be chosen to satisfy air flow requirements of the electronic equipment. In FIG. 4, each peripheral card aperture 56 is stepped inward by the same distance relative to its neighbour above (as viewed in FIG. 4). The amount by which each card is stepped inwardly could, for example, be about ½ inch or, for a broader example, an amount in the range of about ⅛ inch to about 1 ½ inches.

Figure 6:
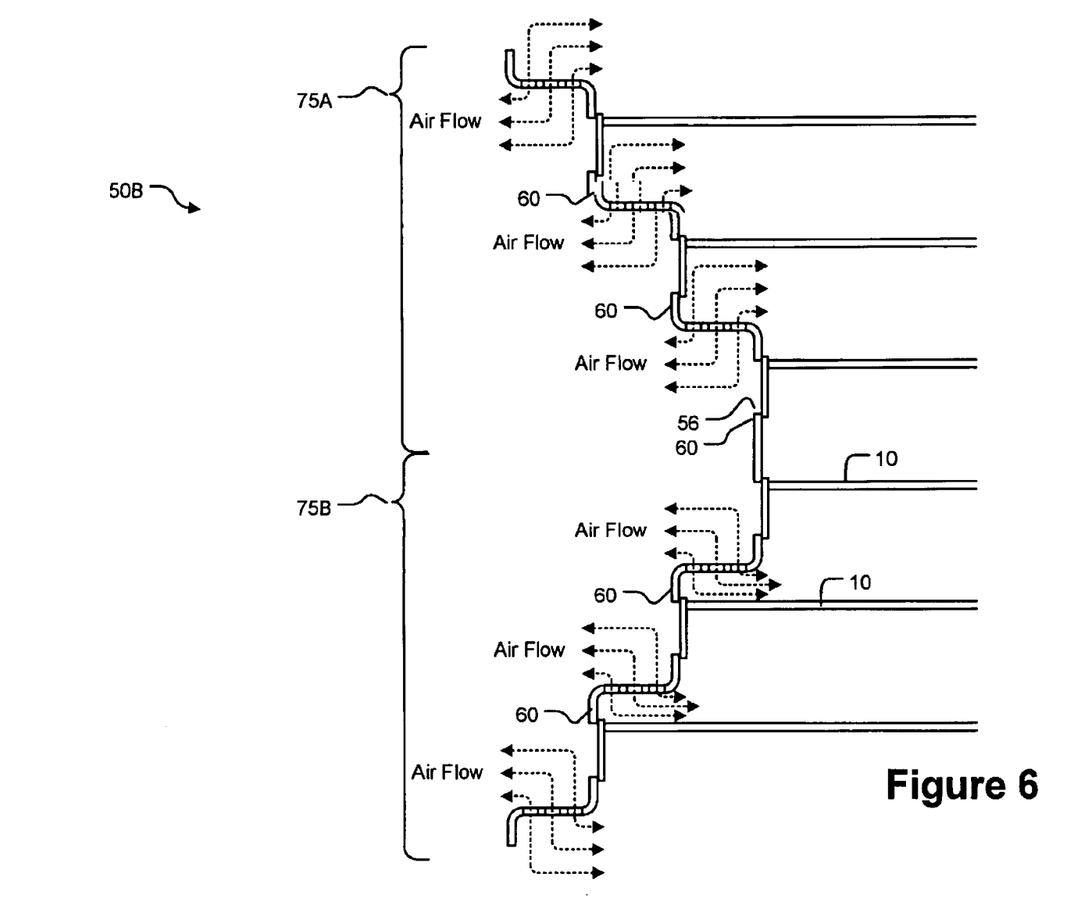
FIG. 6 is a schematic sectional view through a system case and peripheral cards of an electronic system according to the invention illustrating air flow through air vents adjacent to each peripheral card opening.

FIG. 6 shows equipment 50B according to an alternative embodiment of the invention wherein a first set 75A of aperture-bearing portions 60 step successively inwardly as one moves downwardly (relative to the orientation of FIG. 6) and a second set 75B step outwardly as one moves downwardly. In the example shown in FIG. 6, aperture-bearing portions 60 form a bilaterally symmetrical pattern. In an alternative embodiment of the invention (not shown) the first set of aperture-bearing portions step outwardly and the second set of aperture-bearing portions step inwardly.

Figure 7:
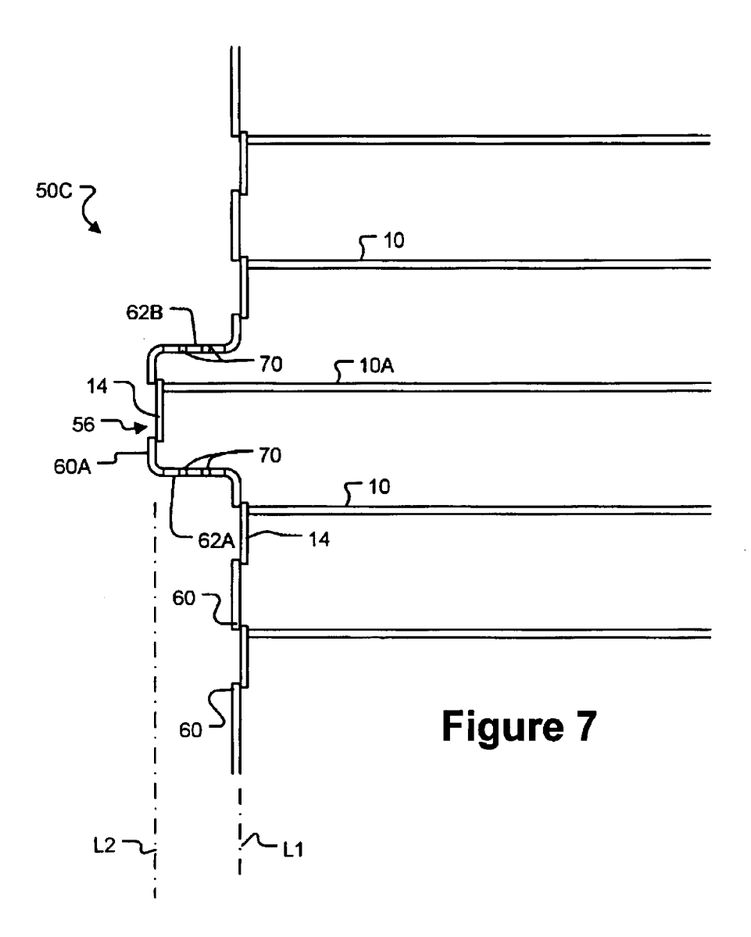
FIG. 7 is a schematic sectional view through a system case and peripheral cards of an electronic system according to an alternative embodiment of the invention having a single peripheral card opening on a protrusion from the main case surface with air vents on the sides of the protrusion.
Figure 8:
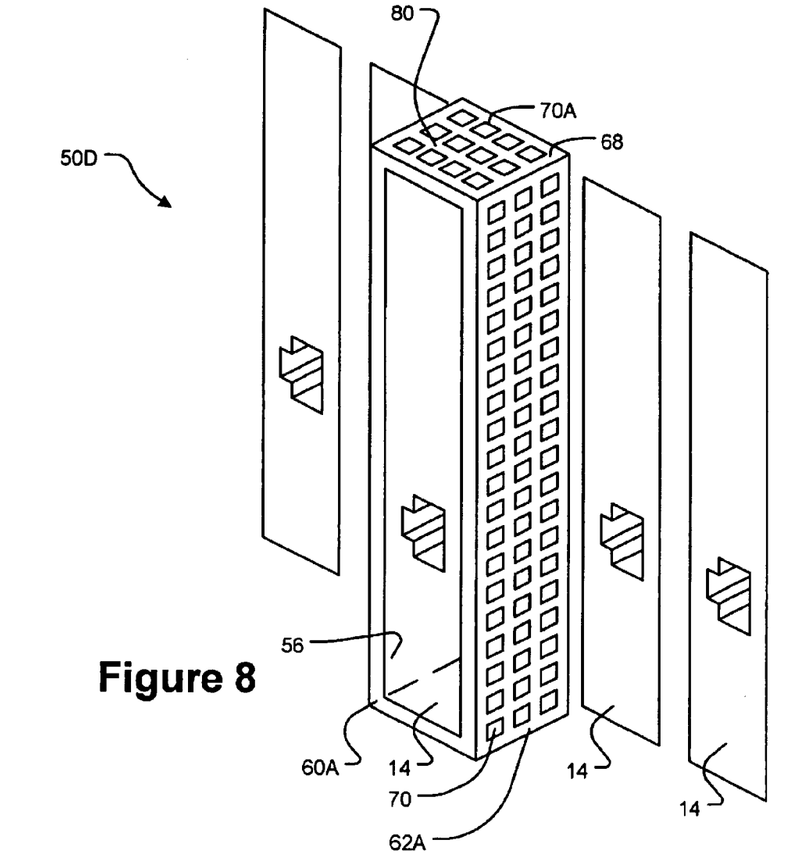

FIGS. 7 and 8 illustrate apparatus 50C and 50D according to further embodiments of the invention in which the plates 14 of most peripheral cards 10 are at the same level L1 and one of the peripheral cards 10A projects to a different level L2 which is greater than L1. The designs illustrated in FIGS. 7 and 8 may be used to provide enhanced venting for a single peripheral card 10A which generates more heat than other peripheral cards 10. In an alternative embodiment of the invention (not shown), L2 is less than L1.

Air vents 70 may be located adjacent to any side of a peripheral card aperture 56. They are not restricted to being located adjacent to a long edge of the peripheral card aperture. FIG. 8 shows apparatus wherein some air vents 70A are located on a transitional surface 78 adjacent a short side of a peripheral card aperture 56.

In the embodiments of FIGS. 7 and 8, an aperture-bearing portion 60A forms an outer end of a projection 80. The sides of projection 80 are formed by transitional portions 62A, 62B, 68 and a transitional portion (not shown) opposed to transitional portion 68.

Figure 9:
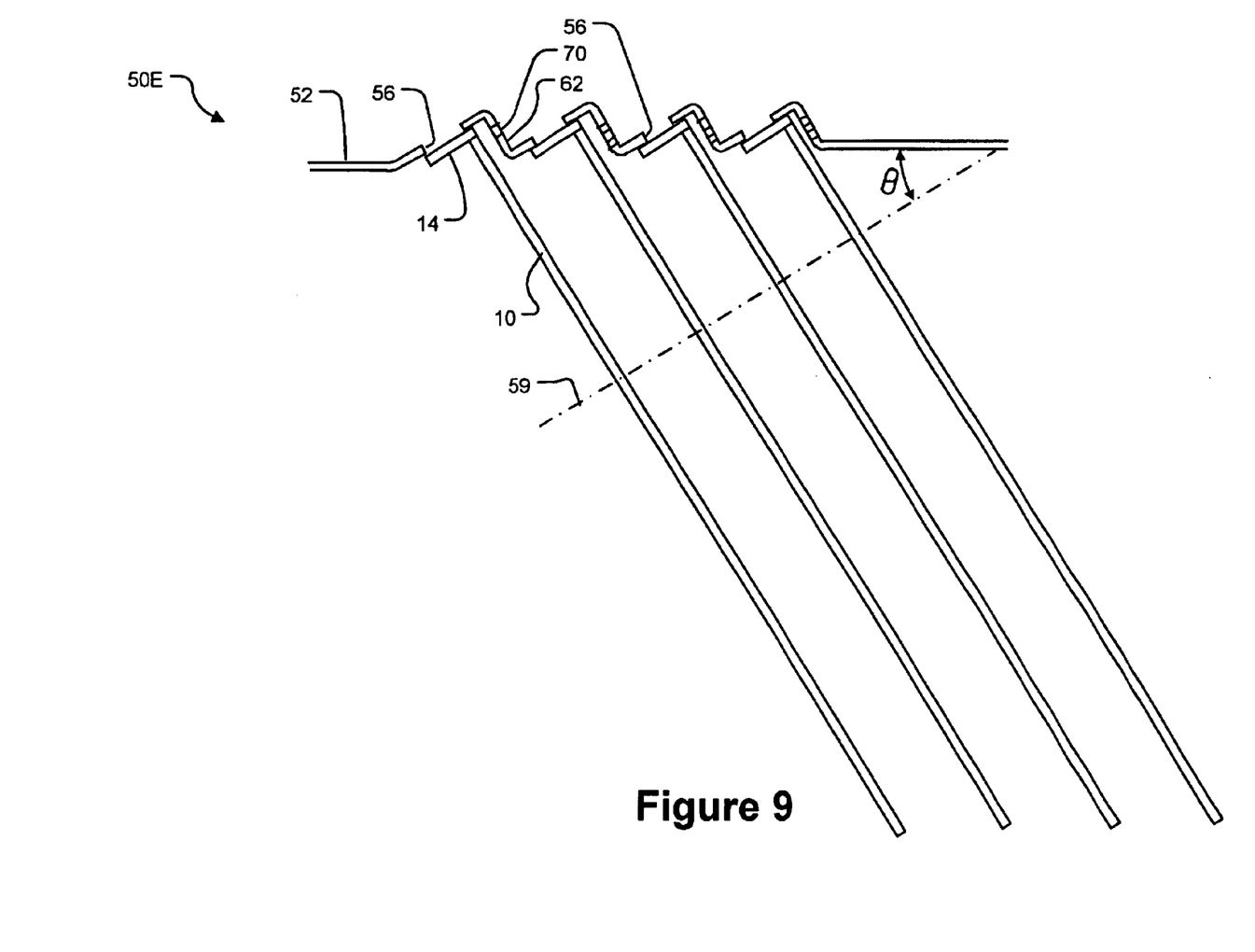

FIG. 9 depicts a system 50E wherein cards 10 are oriented at an acute angle to a face of case 52. In this embodiment, cards 10 each project to a different level relative to an imaginary line 59 which extends at right angles to cards 10. Case 52 is formed to provide a series of steps. One face of each step bears an aperture 56 which corresponds with a plate 14 of a corresponding card 10. The other face of each step constitutes a transitional portion of case 52 which includes vent apertures 70.

In any of the embodiments of the invention described above, any suitable arrangement of fans or other air moving mechanisms may be arranged to cause air to flow in and/or out through apertures 70. Some embodiments of the invention include fans mounted on peripheral cards 10.

It can be seen that the arrangements described herein permits vents to be provided in a case between adjacent peripheral cards 10 without requiring peripheral cards 10 to be spaced apart excessively.

Where a component (e.g. a card, module, assembly, processor, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. Electronic apparatus comprising:
   at least first and second connectors spaced apart from one another to accommodate first and second adjacent parallel cards, the first and second connectors located at different distances in a first direction along the first and second cards from an imaginary line extending perpendicular to the parallel cards;
   a case enclosing the first and second connectors, the case including a wall having first and second aperture-bearing portions respectively carrying first and second apertures respectively located to expose end portions of the first and second cards, the first and second aperture-bearing portions at different levels in the first direction, the case including a transitional portion between the first and second aperture-bearing portions, the transitional portion including at least one vent aperture.

2. Electronic apparatus according to claim 1 wherein the connectors are mounted on a board and the board has an edge extending parallel to the imaginary line.

3. Electronic apparatus according to claim 1 wherein the aperture-bearing portions each extend substantially at right angles to the cards.

4. Electronic apparatus according to claim 1 wherein each of the cards comprises a circuit board and a plate extending substantially at right angles to the circuit board wherein the plates abut the corresponding aperture-bearing portions.

5. Electronic apparatus according to claim 1 wherein at least one of the first and second aperture-bearing portions is located between two transitional portions of the case, each of the transitional portions extending in a direction parallel to the first and second boards and being penetrated by at least one vent aperture.

6. Electronic apparatus according to claim 5 wherein the first aperture-bearing portion is on a projection projecting from surrounding parts of the case and the two transitional portions form sides of the projection.

7. Electronic apparatus according to claim 6 wherein there are venting apertures on transitional portions on at least three sides of the projection.

8. Electronic apparatus according to claim 6 wherein there are venting apertures on each of the two transitional portions.

9. Electronic apparatus according to claim 1 wherein the transitional portion is substantially parallel to the cards.

10. Electronic apparatus according to claim 9 wherein the aperture-bearing portions are substantially at right angles to the transitional portion.

11. Electronic apparatus comprising a plurality of mutually-adjacent slots for receiving added cards, each of the slots comprising a connector spaced-apart from an aperture-bearing portion of a case by a standard distance, the aperture-bearing portions of the case each being apertured to expose an end portion of a card, if present, in the corresponding slot and being at a plurality of different levels relative to an imaginary line extending perpendicular to the slots, the case including one or more transitional portions extending between adjacent aperture-bearing portions of different levels, the transitional portions including vent openings.

12. Electronic apparatus according to claim 11 wherein at least one of the aperture-bearing portions of the case projects outwardly past aperture-bearing portions of the case on either side of the at least one aperture-bearing portion.

13. Electronic apparatus according to claim 12 wherein the projecting aperture-bearing portion is rectangular and has longer sides and shorter sides and the case includes venting apertures on a portion of the case adjacent at least one of the shorter sides of the projecting aperture-bearing portion.

14. Electronic apparatus according to claim 11 wherein each of the plurality of aperture-bearing portions is at a different level from all adjacent aperture-bearing portions and the case comprises a transitional portion between each of the plurality of aperture-bearing portions and each of the adjacent aperture-bearing portions.

15. Electronic apparatus according to claim 11 wherein, for a group of three or more mutually-adjacent ones of the slots, the levels of the aperture-bearing portions increase stepwise across the group.

16. Electronic apparatus according to claim 11 wherein, for a group of three or more mutually-adjacent ones of the slots, every second one of the aperture-bearing portions is at a level more outward than levels of adjacent aperture-bearing portions.

17. Electronic apparatus according to claim 11 wherein, for a group of three or more mutually-adjacent ones of the slots, every second one of the aperture-bearing portions is at a level more inward than levels of adjacent aperture-bearing portions.

18. Electronic apparatus according to claim 10 comprising a card in each of two adjacent ones of the slots, each of the cards comprising an end plate extending in a direction substantially parallel to the corresponding aperture-bearing portions of the case, the edges of the end plates of the cards being spaced apart in a direction transverse to the slots by a distance D wherein a distance measured along a transitional portion of the case connecting the corresponding aperture-bearing portions of the case exceeds D by a factor of at least 3.

* * * * *